United States Patent
Yun et al.

(10) Patent No.: US 9,461,614 B2
(45) Date of Patent: Oct. 4, 2016

(54) ASYMMETRIC UNBALANCED ACOUSTICALLY COUPLED RESONATORS FOR SPURIOUS MODE SUPPRESSION

(71) Applicant: QUALCOMM Incorporated, San Diego, CA (US)

(72) Inventors: Changhan Hobie Yun, San Diego, CA (US); Chengjie Zuo, Santee, CA (US); Mario Francisco Velez, San Diego, CA (US); Daeik Daniel Kim, San Diego, CA (US); Jonghae Kim, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 433 days.

(21) Appl. No.: 14/067,908

(22) Filed: Oct. 30, 2013

(65) Prior Publication Data
US 2015/0115777 A1    Apr. 30, 2015

(51) Int. Cl.
| | |
|---|---|
| H01L 41/047 | (2006.01) |
| H03H 9/17 | (2006.01) |
| H03H 9/02 | (2006.01) |
| H03H 9/13 | (2006.01) |
| H03H 9/56 | (2006.01) |

(52) U.S. Cl.
CPC ............ *H03H 9/17* (2013.01); *H01L 41/047* (2013.01); *H03H 9/02157* (2013.01); *H03H 9/13* (2013.01); *H03H 9/56* (2013.01)

(58) Field of Classification Search
CPC ................................................ H05B 41/2822
USPC .......... 310/311–371; 333/186–189, 197, 200
See application file for complete search history.

(56) References Cited

U.S. PATENT DOCUMENTS

| | | | |
|---|---|---|---|
| 3,660,699 A * | 5/1972 | Sakurai ................. | H01L 41/107 310/326 |
| 4,329,666 A | 5/1982 | Arvanitis | |
| 5,424,602 A * | 6/1995 | Sato ..................... | H01L 41/107 310/359 |
| 6,051,915 A * | 4/2000 | Katsuno ............... | H01L 41/107 310/359 |
| 6,118,209 A * | 9/2000 | Okuyama ............. | C04B 35/493 252/62.9 R |
| 6,192,562 B1 | 2/2001 | Okeshi et al. | |
| 6,758,199 B2 * | 7/2004 | Masters ................ | F02P 9/002 123/620 |
| 7,414,495 B2 | 8/2008 | Iwasaki et al. | |
| 2002/0043900 A1* | 4/2002 | Kim ..................... | H01L 41/107 310/359 |
| 2004/0195937 A1 | 10/2004 | Matsubara et al. | |
| 2012/0050236 A1 | 3/2012 | Lo et al. | |
| 2013/0021305 A1 | 1/2013 | Zuo et al. | |
| 2013/0134838 A1 | 5/2013 | Yun et al. | |
| 2015/0256143 A1* | 9/2015 | Yun ........................ | H03H 9/15 333/186 |

OTHER PUBLICATIONS

Abdolvand R., "Thin-Film Piezoelectric-On-Substrate Resonators and Narrowband Filters," 2008, 135 Pages.
(Continued)

*Primary Examiner* — Thomas Dougherty
(74) *Attorney, Agent, or Firm* — Seyfarth Shaw LLP

(57) ABSTRACT

A resonator includes a piezoelectric core, a set of electrodes, and at least one ground terminal. The electrodes are arranged on the piezoelectric core and also includes at least one input electrode having a first width and at least one output electrode having a second width that differs from the first width. The ground terminal is also on the piezoelectric core.

22 Claims, 7 Drawing Sheets

(56) References Cited

OTHER PUBLICATIONS

Pulskamp J.S., et al., "Electrode-Shaping for the Excitation and Detection of Permitted Arbitrary Modes in Arbitrary Geometries in Piezoelectric Resonators," IEEE Transactions on Ultrasonics, Ferroelectrics, and Frequency Control, vol. 59 (5), May 2012, pp. 1043-1060.

Rosen D., et al., "Suppression of Spurious Lateral Modes in Thickness-Excited FBAR Resonators," Correspondence, IEEE transactions on Ultrasonics, ferroelectrics, and frequency control, vol. 52 (7), Jul. 2005, pp. 1189-1192.

* cited by examiner

ASYMMETRIC UNBALANCED ACOUSTICALLY COUPLED RESONATORS FOR SPURIOUS MODE SUPPRESSION

TECHNICAL FIELD

The present disclosure generally relates to integrated circuits (ICs). More specifically, the present disclosure relates to asymmetric unbalanced acoustically coupled resonators for spurious mode suppression.

BACKGROUND

Filters implemented in integrated circuits may use components known as resonators to generate resonant frequencies. Resonators, however, may experience the problem of spurious responses. A spurious response is any undesirable or unwanted signal on a frequency other than the resonant frequency (e.g., the frequency being broadcast or received). Devices experiencing spurious frequency responses are said to be operating in the spurious mode. A resonator that operates in the spurious mode creates noise and other problems in the overall circuit design of the filter, or any other device that incorporates a resonator.

Resonators may be acoustically coupled such that the electrical signals transmitted through the resonator are transferred acoustically or electromechanically. Resonators may also extend in a lateral fashion, or be horizontally constructed. Often, such horizontal resonators have components, such as electrodes, that are symmetrically structured. Acoustically coupled resonators may also be symmetrical and arranged in a horizontal structure. Acoustically coupled resonators may be implemented in microelectromechanical systems (MEMS) or integrated circuits. Acoustically coupled, horizontal resonators may experience problems such as spurious responses, or operation in the spurious mode.

SUMMARY

In one aspect of the disclosure, a resonator configured for spurious mode suppression is provided. The resonator includes a piezoelectric core, a set of electrodes, and at least one ground terminal. The electrodes are arranged on the piezoelectric core and include one input electrode having a first width and one output electrode having a second width that differs from the first width. The ground terminal is also on the piezoelectric core.

In another aspect of the disclosure, a resonator configured for spurious mode suppression is provided. The resonator includes a piezoelectric core, a set of electrodes, and at least one ground terminal. The electrodes are asymmetrically arranged on the piezoelectric core and include at least one input electrode with an outer edge having a first distance to a first edge of the core and at least one output electrode with an outer edge having a second distance from a second edge of the core. The first distance differs from the second distance. The first edge and the second edge are opposing edges. The ground terminal is provided on the piezoelectric core.

In yet another aspect of the disclosure, a resonator includes a piezoelectric core, means for conducting electricity, and means for coupling to ground. The means for conducting electricity is arranged on the piezoelectric core and includes input means for conducting electricity having a first width and output means for conducting electricity having a second width that differs from the first width. The means for coupling to ground is also on the piezoelectric core.

In still another aspect of the disclosure, a resonator includes a piezoelectric core, means for conducting electricity, and means for coupling to ground. The means for conducting electricity is asymmetrically arranged on the piezoelectric core and includes input means for conducting electricity with an outer edge having a first distance to a first edge of the core and output means for conducting electricity with an outer edge having a second distance from a second edge of the core. The first distance differs from the second distance. The first edge and the second edge are opposing edges. The means for coupling to ground is also on the piezoelectric core.

In another aspect of the disclosure, a method to fabricate an acoustically coupled resonator configured for spurious mode suppression is provided. The method includes forming a piezoelectric core. The method also includes asymmetrically arranging a set of electrodes on the piezoelectric core. The method further includes forming at least one ground terminal on the piezoelectric core.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Resonators can be used as oscillators or as components within a filter to achieve high order frequencies. Acoustically coupled resonators are resonators in which the electrical signals flowing through the resonator are transferred acoustically or electromechanically. Acoustically coupled resonators experience the problem of spurious responses. That is, signals at frequencies other than the resonant frequency appear in the frequency response of the resonator. This is particularly undesirable in a filter, where unwanted frequencies interfere with the filter's operation. If spurious responses continue to occur, the resonator operates in a spurious mode.

In one aspect of the disclosure, the electrodes positioned on a piezoelectric core of a resonator are unbalanced to reduce spurious responses and to suppress the spurious mode. In one configuration, the widths of the electrodes on the piezoelectric core are adjusted to different sizes. In another configuration, the placement of electrodes on the piezoelectric core is adjusted.

For example, the resonator may have a first electrode. The resonator may also have a second electrode. The resonator has a first overhang distance between an outer edge of the first electrode and a first edge of a piezoelectric core. The resonator also has a second overhang distance between an outer edge of the second electrode and a second edge of the piezoelectric core. The first edge and the second edge may be opposing outer edges of the piezoelectric core. In this configuration, the electrodes are unbalanced by adjusting the first distance and the second distance to different values.

In yet another configuration, the electrodes are unbalanced by placing an etched notch between at least two resonators in a multi-finger resonator configuration to introduce an acoustic boundary condition. If the number of fingers (e.g., electrodes) is large, then etched notches may be periodically placed between successive fingers (e.g., between every second and third finger or every fourth and fifth finger).

Figure 1:
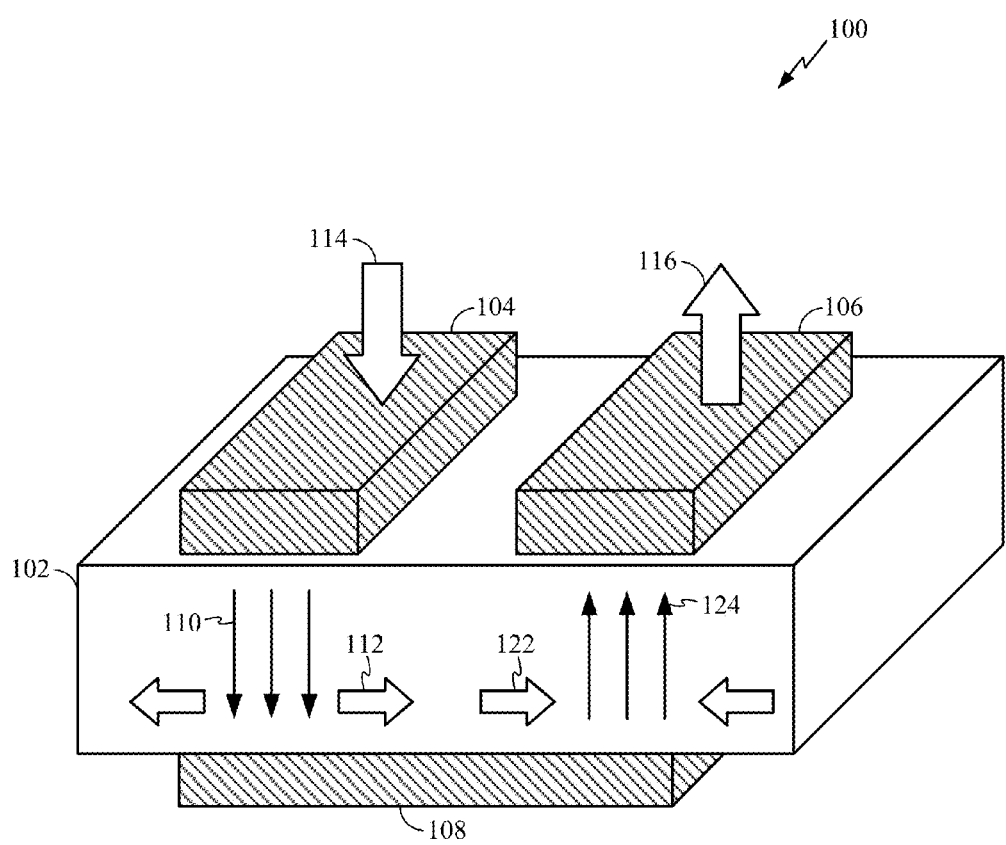
FIG. 1 is a perspective view of a resonator according to an aspect of the present disclosure.

FIG. 1 is a perspective view of a resonator 100 according to an aspect of the present disclosure. For the sake of explanation, acoustically coupled resonators are described, although the present disclosure applies to other types of resonators, as well. The resonator 100 includes a core 102. In one configuration, the core 102 is made of piezoelectric materials such as Aluminum Nitride (AlN) and its alloys, such as those doped with Boron (B), Chromium (Cr), Erbium (Er) or Scandium (Sc); Zinc Oxide (ZnO); Lithium Niobate (LiNbO$_3$), Lithium Tantalate (LiTaO$_3$), Lead Zirconate Titanate or PZT (Pb[Zr$_x$Ti$_{1-x}$]O$_3$ 0≤x≤1), Quartz (SiO$_4$ or SiO$_2$) crystals, and Topaz (Al$_2$SiO$_4$(F,OH)$_2$) crystals. The resonator core 102 may also be made of other like materials having a mechanical structure that can be stimulated in an electrical fashion through electromechanical coupling.

The resonator 100 has a first electrode 104 and a second electrode 106. In one configuration, the first electrode 104 and the second electrode 106 are made of materials including Molybdenum (Mo), Platinum (Pt), Copper (Cu), Aluminum (Al), Silver (Ag), Gold (Au), Tungsten (W), Nickel (Ni), or other like materials. A first signal 114 may be coupled to the first electrode 104, and a second signal 116 may be coupled to the second electrode 106. In one configuration, the first signal 114 may be an electrical input signal and the second signal 116 may be an electrical output signal. The first electrode 104 and the second electrode 106 may be on any surface of the core 102 including opposing (not shown) or adjacent surfaces of the core 102.

The resonator 100 further includes a ground terminal 108. In one configuration, the ground terminal 108 is coupled to a voltage ground or source supply voltage (Vss). The ground terminal 108 may be separated into two or more separate ground terminals, which can be positioned on any surface of the core 102. The first electrode 104 and/or the second electrode 106 and/or a first ground terminal can be positioned on a first surface of the core 102, whereas the other of the first electrode 104 or the second electrode 106, if any, and/or a second ground terminal are positioned on opposing or adjacent surfaces of the core 102.

The resonator 100 operates via a first electrical field 110, a first mechanical displacement 112, a second mechanical displacement 122 and a second electrical field 124. The first mechanical displacement 112 and the second mechanical displacement 122 represent directions of mechanical displacement that occur within the resonator 100 when signals are present on the electrodes. The first electrical field 110 and the second electrical field 124 represent the direction of the electrical field through the resonator 100.

As can be seen by FIG. 1, there are different directional freedoms for both the electrical field and the mechanical displacement. The first direction is expansion. That is, the first signal 114 is input into the first electrode 104, which generates the first electrical field 110, which is then in turn translated into the first mechanical displacement 112 that flows outward and expands a region of the core 102.

The second direction is contraction. That is, the second mechanical displacement 122 translates an inward, contracting mechanical displacement from a region of the core 102 into the second electrical field 124, which flows into the second electrode 106 and becomes output as the second signal 116. The transfer and translation of the electrical field to a mechanical displacement is due to the electromechanical coupling resonance caused by the piezoelectric effect.

The expansion and contraction directions counteract each other in order to maintain constant parameters in the resonator 100, such as a constant resonant frequency. Also, by changing the position of the electrodes on the core 102, the parameters of the resonator 100 are modified and may become unbalanced.

Figure 2:
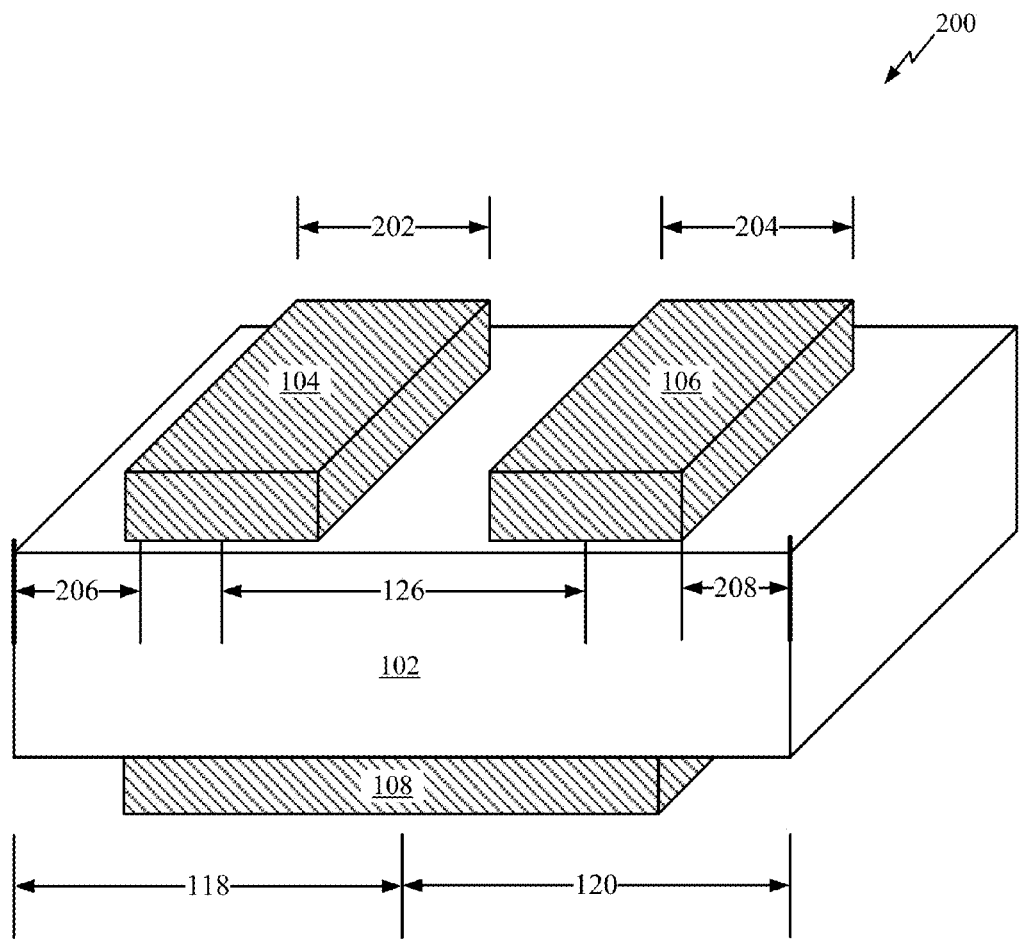
FIG. 2 is another perspective view of a resonator according to an aspect of the present disclosure.

FIG. 2 is another perspective view of a resonator 200 according to an aspect of the present disclosure. The resonator 200 is similar to the resonator 100 in FIG. 1, but can be made unbalanced by modifying a first electrode width 202, a second electrode width 204, a first overhang distance 206 and/or a second overhang distance 208. By modifying the above-described dimensions (e.g., the first electrode width 202, the second electrode width 204, the first overhang distance 206 and the second overhang distance 208), a first pitch 118, a second pitch 120 and an alternate pitch 126 may be modified. Modification of the first pitch 118, the second pitch 120 and/or the alternate pitch 126 affects the resonant frequency as well as any spurious response resulting from the placement of the first electrode 104 and the second electrode 106 on the core 102.

In one configuration, the first overhang distance 206 is between an outer edge of the first electrode 104 and an outer edge of the core 102 that is substantially parallel to the outer edge of the first electrode 104. In one configuration, the second overhang distance 208 is between an outer edge of the second electrode 106 and an outer edge of the core 102 that is substantially parallel to the outer edge of the second electrode 106. In one configuration, the two opposing outer edges of the first electrode 104 forming the first electrode width 202 may be substantially parallel to each other. In one configuration, the two opposing outer edges of the second electrode 106 forming the second electrode width 204 may be substantially parallel to each other.

The resonator 200 includes the adjustable parameters of the first pitch 118, the second pitch 120, and the alternate pitch 126. In one configuration, each of the pitches may represent the distance between an outer edge of the core 102 to a mid-point of the core 102. The mid-point of the core 102 may also be positioned in the very middle of two electrodes (e.g., the first electrode 104 and the second electrode 106). An electrode may also be positioned in the very middle of each of the pitches, as shown by the first electrode 104 in the middle of the first pitch 118 and the second electrode 106 in the middle of the second pitch 120.

In another configuration, the pitches may represent the distance between the center of one electrode (e.g., the first electrode 104) to the center of another electrode (e.g., the second electrode 106). This is shown by the alternate pitch 126.

In one configuration, the first pitch 118 and the second pitch 120 are the same. In another configuration, the first pitch 118 and the second pitch 120 are different. The first pitch 118 and the second pitch 120 determine the value of the resonant frequency or the fundamental resonance of the resonator 200. For example, say that the value of both the first pitch 118 and the second pitch 120 is "W". In one configuration, the wavelength corresponding to the overall frequency of the resonator 200 would be 2 W. Half this wavelength is W, which is the wavelength corresponding to the resonant frequency of the resonator 200. Therefore, the resonant frequency of the resonator 100 can be calculated from knowing the value of the first pitch 118 and the second pitch 120. The formula for calculating any frequency is to divide the speed of light by the relevant wavelength. In one configuration, the resonant frequency of the resonator 200 is around 700 MHz.

The signal transmitted by the first electrode 104 leads to a spurious response occurring at a frequency that is approximately a quarter (¼) of the frequency of the resonator 200. The signal transmitted by the second electrode 106 also leads to another spurious response occurring at a frequency that is roughly ¾ of the frequency of the resonator 200. For example, the overall frequency of a resonator is 1400 MHz, with a resonant frequency at 700 MHz (½ of 1400 MHz). There would then be, at the very least, a first undesired spurious response at approximately 350 MHz (¼ of 1400 MHz) and a second undesired spurious response at approximately 1050 MHz (¾ of 1400 MHz). Therefore, the position of the electrodes on the core 102 leads to the occurrence of different spurious responses at different frequencies.

The edges of the core 102 in the resonator 200 experience the maximum mechanical displacement. For example, the edges would experience the most displacement in a positive "+x" linear direction. The very middle of the core 102 in the resonator 100 experiences the minimum mechanical displacement. For example, the middle would experience the lowest displacement, in a negative "−x" linear direction.

A more neutral mechanical displacement is experienced at a first region and a second region. The first region, where the first electrode 104 may be positioned, is at the mid-point between one outer edge of the core 102 and the middle of the core 102. The second region, where the second electrode 106 may be positioned, is at the mid-point between another outer edge of the core 102 (not the outer edge of the first region) and the middle of the core 102. Because the first region and the second region have a more neutral displacement, they also have the maximum electrical charge and the strongest electrical field. An electrode (such as the first electrode 104 or the second electrode 106) picks up a larger amount of charge generated in the first region and second region if placed there.

The presence of electrodes in a resonator design leads to unwanted spurious responses at frequencies other than the resonant frequency. The movement of the resonator also includes the movement of the resonator at the various frequencies as described above. Therefore, according to an aspect of the present disclosure, an unbalanced resonator design decreases the presence of spurious responses at unwanted frequencies by reducing or even eliminating the spurious response and/or by moving the spurious frequency to a frequency that does not affect the resonator operation.

The resonator 200 is unbalanced because modification of the above-described dimensions (e.g., the first electrode width 202, the second electrode width 204, the first overhang distance 206 and the second overhang distance 208) causes the first electrode 104 and the second electrode 106 to become asymmetrical, thereby also throwing off the balance and symmetry of the rest of the resonator 200. This unbalancing allows the adjustment of resonator properties for suppressing spurious responses that occur at undesired frequencies. In one configuration, the strength of the spurious responses at undesired frequencies can be reduced by as much as 15 dB or more by adjusting the above-described dimensions (e.g., the first electrode width 202, the second electrode width 204, the first overhang distance 206 and the second overhang distance 208). In one configuration, the difference between the first electrode width 202 and the second electrode width 204 ranges from around 0.2 μm to around 0.4 μm. In one configuration, the difference between the first overhang distance 206 and the second overhang distance 208 ranges from around 0.2 μm to around 0.4 μm.

The rejection/suppression of unwanted spurious response frequencies for a filter can be amplified in a cascade, multi-stage resonator configuration. In one configuration, if the reduction of unwanted spurious response frequencies is 15 dB in one stage, it becomes 30 dB in two stages, 45 dB in three stages, and so on. In a cascade, multi-stage configuration, spurious response frequencies are significantly attenuated, while some dominant frequencies survive, such as the resonant frequency. The cascade, multi-stage approach also suppresses the unwanted spurs (e.g., spurious frequency responses) without having to use external passive components, such as inductors and capacitors. This saves space as well as manufacturing costs.

Figure 3:
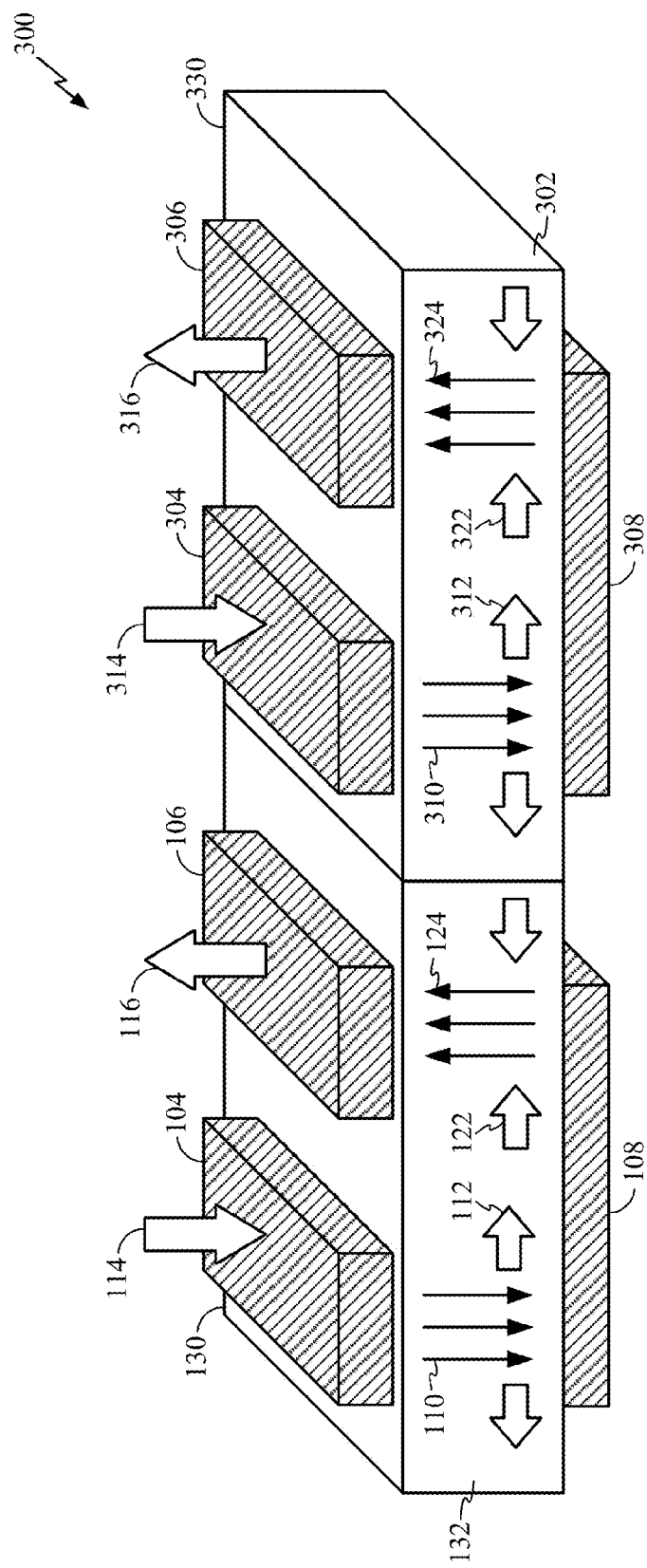
FIG. 3 is a perspective view of a multi-finger resonator according to an aspect of the present disclosure.

FIG. 3 is a perspective view of a multi-finger resonator 300 according to an aspect of the present disclosure. The multi-finger resonator 300 includes a first resonator 130 (that is identical to the resonator 100 in FIG. 1) on the left, and a second resonator 330 (that is also identical to the resonator 100 in FIG. 1) on the right. The fingers of the multi-finger resonator 300 are the four electrodes shown in FIG. 3: a first electrode 104, a second electrode 106, a third electrode 304 and a fourth electrode 306. In one configuration, adjusting the placement of the outermost electrodes—the first electrode 104 and the fourth electrode 306—would control or suppress the largest spurious response(s) in the multi-finger resonator 300. The configuration of the multi-finger resonator 300 may also be used to lower the collective electrical impedance of the overall device by having more fingers to match the resonator circuit to radio frequency (RF) environments having a particular resistance (e.g., 50Ω).

A core 132, the first electrode 104, the second electrode 106, a ground terminal 108, a first electrical field 110, a first mechanical displacement 112, a second mechanical displacement 122, a second electrical field 124, a first signal 114 and a second signal 116 may be identical to, respectively, a core 302, the third electrode 304, the fourth electrode 306, a ground terminal 308, a first electrical field 310, a first mechanical displacement 312, a second mechanical displacement 322, a second electrical field 324, a third signal 314 and a fourth signal 316. In one configuration, the first signal 114 is the same as the third signal 314 and the second signal 116 is the same as the fourth signal 316. In one configuration, the multi-finger resonator 300 shares a single ground terminal (not shown) instead of having the ground terminal 108 and the ground terminal 308.

In one configuration, there may be an odd number of fingers or electrodes (e.g., three, five, seven, nine, and so on) in a multi-finger resonator structure. For example, in the case of three electrodes, the properties of the overall device would be modeled as one and a half (1.5) resonators. A half (0.5) resonator structure would be one electrode, and would have the frequency properties of one electrode as well. In any multi-finger resonator having an odd number of fingers, the placement of the electrodes would control or suppress any spurious responses. Adjusting the placement of the outermost electrodes would also control or suppress the largest spurious response(s).

Figure 4:
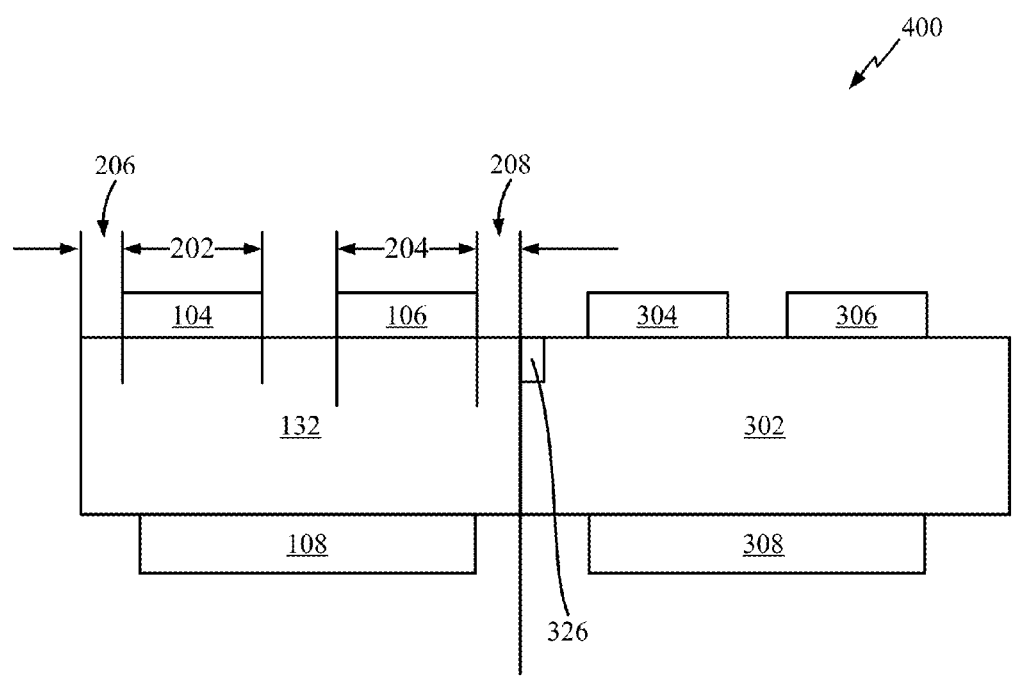
FIG. 4 is a side view of a multi-finger resonator according to an aspect of the present disclosure.

FIG. 4 is a side view of a multi-finger resonator 400 according to an aspect of the present disclosure. The multi-finger resonator 400 is similar to the multi-finger resonator 300 of FIG. 3. In this configuration, the multi-finger resonator 400 has an etched notch 326.

The etched notch 326 can be placed between any two resonators in a multi-finger resonator structure to introduce an acoustic boundary condition. In one configuration, the etched notch 326 is placed between any two fingers or any two electrodes to also introduce an acoustic boundary. The acoustic boundary is a way to place an offset in the overall resonator circuit, which can alter periodicity or create additional asymmetry in the multi-finger resonator 400. For example, if two resonators or two fingers are separated by an etched notch such as the etched notch 326, then one resonator or one finger may be selectively stimulated while eliminating or reducing the frequency response from other resonators or fingers. In other words, certain resonating modes may be selectively stimulated while other harmonic modes may be suppressed, such as the spurious mode caused by unwanted spurious response frequencies. The resonant frequency of the overall resonator may also be tuned via selective placement of etched notches, such as the etched notch 326.

In one configuration, the etched notch 326 has a depth of 0.2 μm. Typical etching procedures such as dry plasma etching or wet chemical etching may be used to create the etched notch 326. In one configuration, resonators are periodically attached in a multi-finger resonator structure, each resonator configured with unbalanced, asymmetrical electrode widths and overhang distances that can be continually adjusted. Such a multi-finger resonator structure is scalable to multiple, even-numbered finger amounts such as 2, 4, 6, 8, etc.

The multi-finger resonator 400 of FIG. 4 also has dimensions that include a first electrode width 202, a second electrode width 204, a first overhang distance 206 and a second overhang distance 208, which are similar to the same dimensions described for the resonator 200 of FIG. 2. In one configuration (not shown), there is one shared ground terminal for the multi-finger resonator 400 instead of the ground terminal 108 and the ground terminal 308.

Thus, spurious mode suppression is disclosed. Resonators configured for spurious mode suppression can be implemented in filters that can support multiple pass bands of different communication standards. By suppressing spurious mode, unwanted frequencies are reduced.

Figure 5:
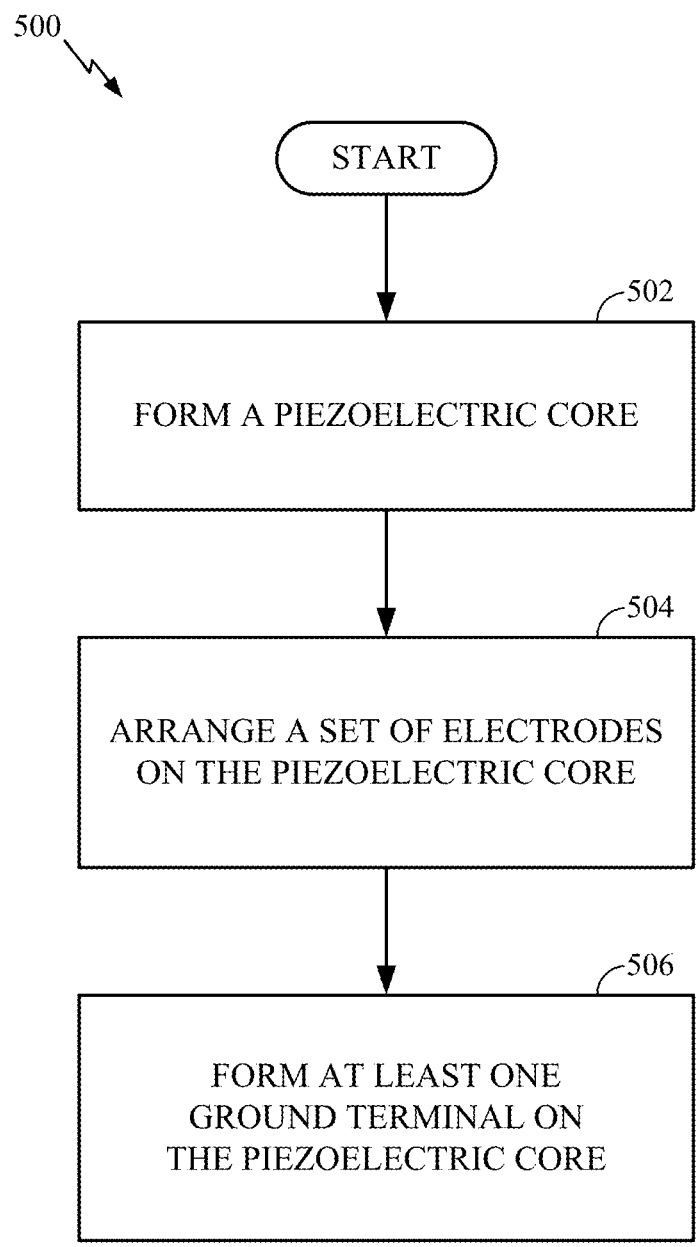
FIG. 5 is a process flow diagram illustrating a method of making a resonator according to an aspect of the present disclosure.

FIG. 5 is a process flow diagram illustrating a method 500 of making a resonator according to an aspect of the present disclosure. In block 502, a piezoelectric core (such as the core 102 in FIGS. 1-2 or the core 132 and the core 302 in FIGS. 3-4) is formed. In block 504, electrodes (such as the first electrode 104 and the second electrode 106 in FIGS. 1-4 and/or the third electrode 304 and the fourth electrode 306 in FIGS. 3-4) may be arranged on the piezoelectric core. In one configuration, the set of electrodes are asymmetrically arranged by varying the electrode widths or the overhang distances in order to create an unbalanced resonator. In block 506, at least one ground terminal (such as the ground terminal 108 in FIGS. 1-4 or the ground terminal 308 in FIGS. 3-4) is formed on the piezoelectric core.

In one configuration, a bottom-to-top sequence is followed to form a resonator according to an aspect of the present disclosure. In this configuration, the at least one ground terminal is formed first. Once formed, the piezoelectric core is formed on the at least one ground terminal. Electrodes are then arranged on the piezoelectric core. Finally, an etched notch is formed in the piezoelectric core.

In one configuration, the ground terminal may be formed on any surface of the piezoelectric core. The electrodes include at least one input electrode and at least one output electrode. In one configuration, the input electrode and a ground terminal are on one surface of the piezoelectric core, and the output electrode and another ground terminal are on an opposite surface of the piezoelectric core. In another configuration, the input electrode and the output electrode are on one surface of the piezoelectric core, and the ground terminal is on an opposite surface of the piezoelectric core.

In one aspect of the disclosure includes means for conducting electricity. The means for conducting electricity include the first electrode 104, the second electrode 106, the third electrode 304 and the fourth electrode 306 in FIGS. 1-4. Other structures are also contemplated for the conducting means. The means for coupling to the ground includes the ground terminal 108 in FIGS. 1-2 and the ground terminal 108 and the ground terminal 308 in FIGS. 3-4.

Figure 6:
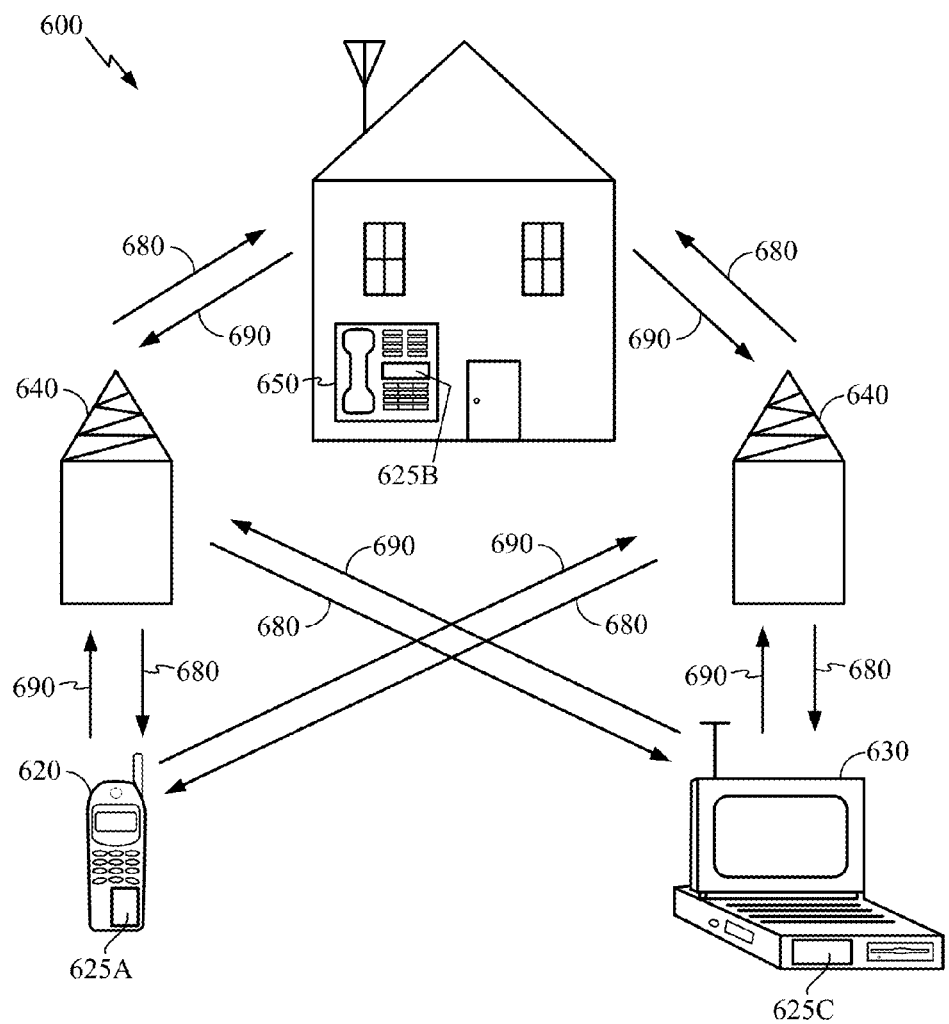
FIG. 6 is a block diagram showing an exemplary wireless communication system in which a configuration of the disclosure may be advantageously employed.

FIG. 6 is a block diagram showing an exemplary wireless communication system 600 in which an aspect of the disclosure may be advantageously employed. For purposes of illustration, FIG. 6 shows three remote units 620, 630, and 650 and two base stations 640. It will be recognized that wireless communication systems may have many more remote units and base stations. Remote units 620, 630, and 650 include IC devices 625A, 625C, and 625B that include the disclosed resonators. It will be recognized that other devices may also include the disclosed resonators, such as the base stations, switching devices, and network equipment. FIG. 6 shows forward link signals 680 from the base station 640 to the remote units 620, 630, and 650 and reverse link signals 690 from the remote units 620, 630, and 650 to base stations 640.

In FIG. 6, remote unit 620 is shown as a mobile telephone, remote unit 630 is shown as a portable computer, and remote unit 650 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 6 illustrates remote units according to the aspects of the disclosure, the disclosure is not limited to these exemplary illustrated units. Aspects of the disclosure may be suitably employed in many devices, which include the disclosed resonators.

Figure 7:
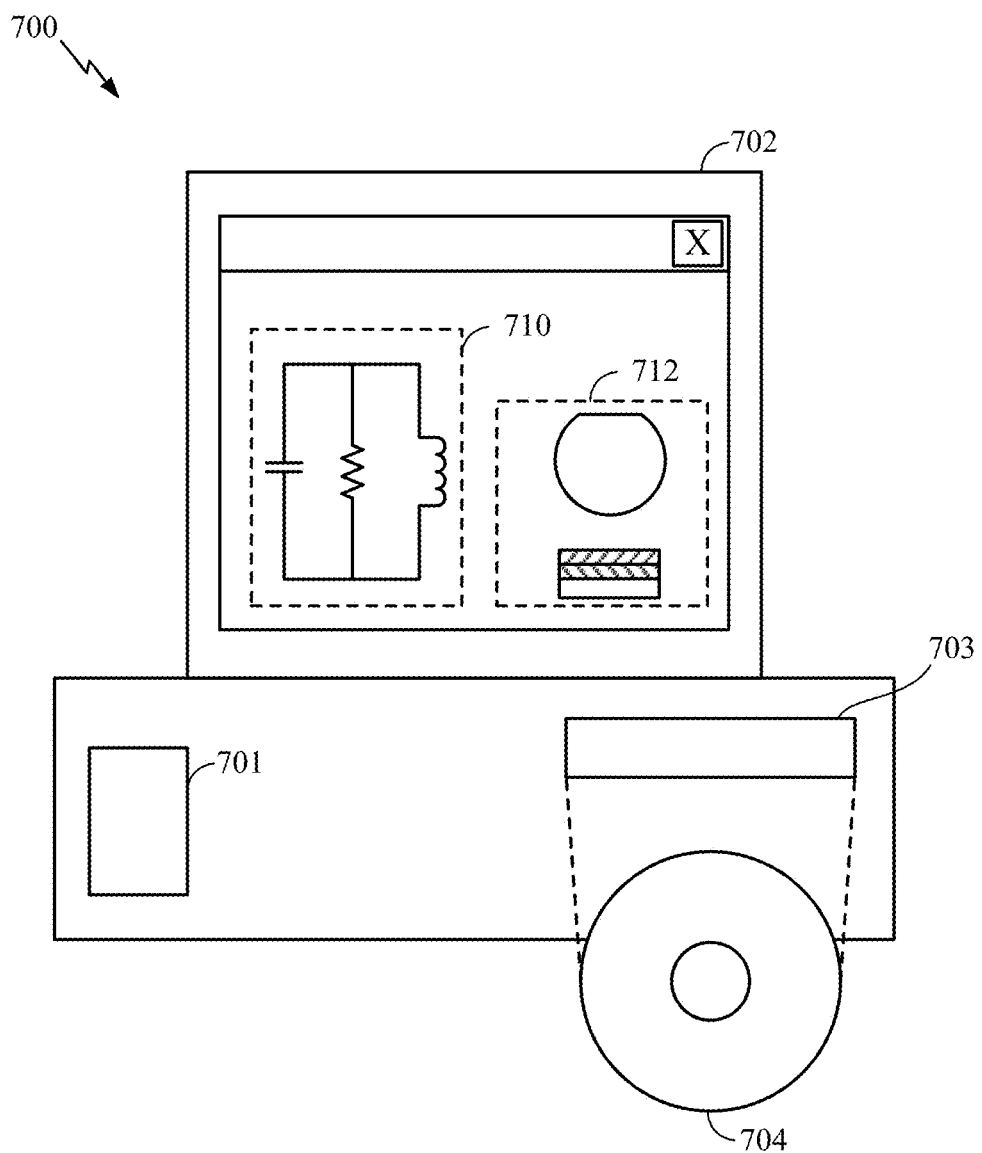
FIG. 7 is a block diagram illustrating a design workstation used for circuit, layout, and logic design of a semiconductor component according to one configuration.

FIG. 7 is a block diagram illustrating a design workstation used for circuit, layout, and logic design of a semiconductor component, such as the resonators disclosed above. A design workstation 700 includes a hard disk 701 containing operating system software, support files, and design software such as Cadence or OrCAD. The design workstation 700 also includes a display 702 to facilitate design of a circuit 710 or a semiconductor component 712 such as a resonator. A storage medium 704 is provided for tangibly storing the design of circuit 710 or the semiconductor component 712. The design of the circuit 710 or the semiconductor component 712 may be stored on the storage medium 704 in a file format such as GDSII or GERBER. The storage medium 704 may be a CD-ROM, DVD, hard disk, flash memory, or other appropriate device. Furthermore, the design workstation 700 includes a drive apparatus 703 for accepting input from or writing output to the storage medium 704.

Data recorded on the storage medium 704 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 704 facilitates the design of the circuit 710 or the semiconductor component 712 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A resonator, comprising:
   a piezoelectric core;
   a plurality of electrodes arranged on the piezoelectric core, the plurality of electrodes including at least one input electrode having a first width and at least one output electrode having a second width that differs from the first width, in which the plurality of electrodes are asymmetrically arranged by having different overhang distances between an outer edge of each electrode and an outer edge of the piezoelectric core that is substantially parallel to the outer edge of each of the plurality of electrodes; and
   at least one ground terminal on the piezoelectric core.

2. The resonator of claim 1, further comprising a notch between a first of the plurality of electrodes and a second of the plurality of electrodes.

3. The resonator of claim 1, in which the at least one ground terminal comprises a plurality of separate ground electrodes.

4. The resonator of claim 1, in which the at least one input electrode and the at least one ground terminal is on one surface of the piezoelectric core, and the at least one output electrode and the at least one ground terminal is on an opposite surface of the piezoelectric core.

5. The resonator of claim 1, in which the at least one input electrode and the at least one output electrode is on one surface of the piezoelectric core, and the at least one ground terminal is on an opposite surface of the piezoelectric core.

6. The resonator of claim 1 integrated into a mobile phone, a set top box, a music player, a video player, an entertainment unit, a navigation device, a computer, a hand-held personal communication systems (PCS) unit, a portable data unit, and/or a fixed location data unit.

7. A resonator, comprising:
a piezoelectric core;
a plurality of electrodes asymmetrically arranged on the piezoelectric core, the plurality of electrodes including at least one input electrode with an outer edge having a first overhang distance to a first edge of the core and at least one output electrode with an outer edge having a second overhang distance from a second edge of the core, the first overhang distance differing from the second overhang distance and the first edge and the second edge being opposing edges; and
at least one ground terminal on the piezoelectric core.

8. The resonator of claim 7, further comprising a notch between a first of the plurality of electrodes and a second of the plurality of electrodes.

9. The resonator of claim 7, in which the at least one input electrode and the at least one ground terminal is on one surface of the piezoelectric core, and the at least one output electrode and the at least one ground terminal is on an opposite surface of the piezoelectric core.

10. The resonator of claim 7, in which the at least one input electrode and the at least one output electrode is on one surface of the piezoelectric core, and the at least one ground terminal is on an opposite surface of the piezoelectric core.

11. The resonator of claim 7 integrated into a mobile phone, a set top box, a music player, a video player, an entertainment unit, a navigation device, a computer, a hand-held personal communication systems (PCS) unit, a portable data unit, and/or a fixed location data unit.

12. A resonator, comprising:
a piezoelectric core;
means for conducting electricity arranged on the piezoelectric core, the means for conducting electricity including input means for conducting electricity having a first width and output means for conducting electricity having a second width that differs from the first width, in which the electricity conducting means are asymmetrically arranged by having different overhang distances between an outer edge of each electricity conducting means and an outer edge of the piezoelectric core that is substantially parallel to the outer edge of each of the electricity conducting means; and
means for coupling to ground, the ground coupling means being provided on the piezoelectric core.

13. The resonator of claim 12, further comprising a notch between a first of the electricity conducting means and a second of the electricity conducting means.

14. The resonator of claim 12, in which the ground coupling means comprises a plurality of separate ground electrodes.

15. The resonator of claim 12, in which at least one of the input means and at least one of the ground coupling means are on one surface of the piezoelectric core, and at least one of the output means and at least one of the ground coupling means are on an opposite surface of the piezoelectric core.

16. The resonator of claim 12, in which at least one of the input means and at least one of the output means are on one surface of the piezoelectric core, and at least one of the ground coupling means are on an opposite surface of the piezoelectric core.

17. The resonator of claim 12 integrated into a mobile phone, a set top box, a music player, a video player, an entertainment unit, a navigation device, a computer, a hand-held personal communication systems (PCS) unit, a portable data unit, and/or a fixed location data unit.

18. A resonator, comprising:
a piezoelectric core;
means for conducting electricity asymmetrically arranged on the piezoelectric core, the means for conducting electricity including input means for conducting electricity with an outer edge having a first overhang distance to a first edge of the core and output means for conducting electricity with an outer edge having a second overhang distance from a second edge of the core, the first overhang distance differing from the second overhang distance and the first edge and the second edge being opposing edges; and
means for coupling to ground on the piezoelectric core.

19. The resonator of claim 18, further comprising a notch between a first of the electricity conducting means and a second of the electricity conducting means.

20. The resonator of claim 18, in which at least one of input electrode and at least one ground coupling means is on one surface of the piezoelectric core, and at least one output of the means and at least one of the ground coupling means are on an opposite surface of the piezoelectric core.

21. The resonator of claim 18, in which at least one of the input means and at least one of the output means are on one surface of the piezoelectric core, and at least one of the ground coupling means are on an opposite surface of the piezoelectric core.

22. The resonator of claim 18 integrated into a mobile phone, a set top box, a music player, a video player, an entertainment unit, a navigation device, a computer, a hand-held personal communication systems (PCS) unit, a portable data unit, and/or a fixed location data unit.

* * * * *